(12) United States Patent
Kumar et al.

(10) Patent No.: US 10,134,894 B2
(45) Date of Patent: Nov. 20, 2018

(54) DUAL GATE FD-SOI TRANSISTOR

(71) Applicant: STMICROELECTRONICS INTERNATIONAL N.V., Amsterdam (NL)

(72) Inventors: Anand Kumar, Noida (IN); Ankit Agrawal, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 76 days.

(21) Appl. No.: 14/985,264

(22) Filed: Dec. 30, 2015

(65) Prior Publication Data

US 2016/0111534 A1    Apr. 21, 2016

Related U.S. Application Data

(60) Division of application No. 14/231,459, filed on Mar. 31, 2014, which is a continuation-in-part of
(Continued)

(51) Int. Cl.
*H01L 29/78* (2006.01)
*H01L 21/265* (2006.01)
(Continued)

(52) U.S. Cl.
CPC .... *H01L 29/7831* (2013.01); *H01L 21/26513* (2013.01); *H01L 21/31111* (2013.01); *H01L 21/7624* (2013.01); *H01L 21/84* (2013.01); *H01L 27/1203* (2013.01); *H01L 29/0649* (2013.01); *H01L 29/51* (2013.01);
(Continued)

(58) Field of Classification Search
CPC ..... H01L 2924/13085; H01L 29/66484; H01L 29/7831; H01L 29/78645; H01L 29/78648
See application file for complete search history.

(56) References Cited

U.S. PATENT DOCUMENTS 5,047,816 A    9/1991  Cuevas
5,099,227 A    3/1992  Geiszler et al.
(Continued)

OTHER PUBLICATIONS

Yamaoka et al., "SRAM Circuit With Expanded Operating Margin and Reduced Stand-By Leakage Current Using Thin-BOX FD-SOI Transistors," *IEEE Journal of Solid-State Circuits* 41(11):2366-2372, Nov. 2006.
(Continued)

*Primary Examiner* — David Spalla
(74) *Attorney, Agent, or Firm* — Seed Intellectual Property Law Group LLP

(57) ABSTRACT

Circuit module designs that incorporate dual gate field effect transistors are implemented with fully depleted silicon-on-insulator (FD-SOI) technology. Lowering the threshold voltages of the transistors can be accomplished through dynamic secondary gate control in which a back-biasing technique is used to operate the dual gate FD-SOI transistors with enhanced switching performance. Consequently, such transistors can operate at very low core voltage supply levels, down to as low as about 0.4 V, which allows the transistors to respond quickly and to switch at higher speeds. Performance improvements are shown in circuit simulations of an inverter, an amplifier, a level shifter, and a voltage detection circuit module.

20 Claims, 9 Drawing Sheets

Related U.S. Application Data application No. 14/078,236, filed on Nov. 12, 2013, now Pat. No. 9,178,517.

(51) Int. Cl.

| | |
|---|---|
| *H01L 21/311* | (2006.01) |
| *H01L 21/762* | (2006.01) |
| *H01L 29/06* | (2006.01) |
| *H01L 29/51* | (2006.01) |
| *H01L 29/66* | (2006.01) |
| *H01L 27/12* | (2006.01) |
| *H01L 21/84* | (2006.01) |
| *H01L 29/786* | (2006.01) |

(52) U.S. Cl.
CPC ...... *H01L 29/517* (2013.01); *H01L 29/66484* (2013.01); *H01L 29/78648* (2013.01)

(56) References Cited

U.S. PATENT DOCUMENTS

| | | | |
|---|---|---|---|
| 5,977,816 | A | 11/1999 | Lee |
| 6,130,117 | A | 10/2000 | Walker et al. |
| 6,407,427 | B1 | 6/2002 | Oh |
| 6,407,429 | B1 | 6/2002 | Ko et al. |
| 6,452,234 | B1 | 9/2002 | Mahanpour |
| 6,534,831 | B2 | 3/2003 | Kato |
| 6,548,870 | B1 | 4/2003 | Lee |
| 6,954,100 | B2 | 10/2005 | Dharne et al. |
| 6,963,226 | B2 | 11/2005 | Chiang |
| 7,061,050 | B2 | 6/2006 | Fazan et al. |
| 7,205,190 | B2 | 4/2007 | Okihara |
| 7,256,456 | B2 | 8/2007 | Ohkubo et al. |
| 7,314,794 | B2 | 1/2008 | Nowak |
| 7,385,436 | B2 * | 6/2008 | Itoh .................. H01L 21/84 257/E21.415 |
| 2002/0182784 | A1 | 12/2002 | Hirashita et al. |
| 2003/0209761 | A1 * | 11/2003 | Yagishita ............. H01L 21/84 257/347 |
| 2005/0269642 | A1 | 12/2005 | Minami |
| 2007/0040584 | A1 | 2/2007 | Ngo et al. |
| 2007/0063284 | A1 | 3/2007 | Kawahara et al. |
| 2007/0063758 | A1 | 3/2007 | Allard et al. |
| 2008/0116939 | A1 * | 5/2008 | Takizawa ............ H01L 21/84 326/103 |
| 2009/0134468 | A1 | 5/2009 | Tsuchiya et al. |
| 2009/0261873 | A1 | 10/2009 | Lin et al. |
| 2010/0080270 | A1 | 4/2010 | Chen et al. |
| 2010/0264492 | A1 | 10/2010 | Surdeanu et al. |
| 2011/0102070 | A1 | 5/2011 | Chen et al. |
| 2011/0108908 | A1 | 5/2011 | Lebby et al. |
| 2011/0165739 | A1 | 7/2011 | Majumdar et al. |
| 2011/0171792 | A1 | 7/2011 | Chang et al. |
| 2011/0181319 | A1 | 7/2011 | Kawahara et al. |
| 2012/0098069 | A1 | 4/2012 | Akhtar |
| 2012/0169398 | A1 | 7/2012 | Brindle et al. |
| 2012/0187998 | A1 | 7/2012 | Jarrar et al. |
| 2012/0261792 | A1 | 10/2012 | Cheng et al. |
| 2013/0005095 | A1 * | 1/2013 | Cai .................. H01L 27/1203 438/154 |
| 2013/0020644 | A1 * | 1/2013 | Horita ................. G11C 11/412 257/351 |
| 2013/0088287 | A1 | 4/2013 | Araki et al. |
| 2013/0162358 | A1 | 6/2013 | Xiao et al. |
| 2013/0277747 | A1 | 10/2013 | Liu et al. |
| 2014/0124845 | A1 | 5/2014 | Cheng et al. |
| 2014/0167834 | A1 | 6/2014 | Stuber et al. |
| 2015/0145046 | A1 * | 5/2015 | Yin .................. H01L 29/66772 257/349 |
| 2015/0171749 | A1 | 6/2015 | Guo et al. |

OTHER PUBLICATIONS

U.S. Appl. No. 14/231,459, filed Mar. 31, 2014, Dual Gate FD-SOI Transistor.

U.S. Appl. No. 14/219,786, filed Mar. 19, 2014, Replacement of Passive NWELL and PWELL Capacitance Devices in FDSOI by NMOS and PMOS Devices.

U.S. Appl. No. 14/985,759, filed Dec. 31, 2015, Integrated Circuit Capacitors for Analog Microcircuits.

Eng et al., "Self-Aligned π-Shaped Source/Drain Ultrathin SOI MOSFETs," in *Micro Electronic and Mechanical Systems*, Takahata (ed.), InTech, 2009, pp. 235-244, 2009.

"Test Structures for SOI MOSFET," Keysight Knowledge Center, retrieved from http://edadocs.software.keysight.com/display/iccap2010/Test+structures+for+SOI+MOSFET on Feb. 5, 2018, 4 pages.

Rosli et al., "A Comparative Study on SOI MOSFETs for Low Power Applications," *Research Journal of Applied Sciences, Engineering and Technology* 5(7):2589-2591, 2013.

Shalev et al., "Standard CMOS Fabrication of a Sensitive Fully Depleted Electrolyte-Insulator-Semiconductor Field Effect Transistor for Biosensor Applications," *Sensors* 9:4366-4379, 2009.

Sunami, "Dimension Increase in Metal-Oxide-Semiconductor Memories and Transistors," in *Advances in Solid State Circuites Technologies*, Chu (ed.), InTech, 2010, pp. 307-332.

\* cited by examiner

DUAL GATE FD-SOI TRANSISTOR

CROSS-REFERENCE TO RELATED APPLICATION

The present patent application is a divisional of U.S. patent application Ser. No. 14/231,459, filed Mar. 31, 2014, which is a continuation-in-part of U.S. patent application Ser. No. 14/078,236, filed Nov. 12, 2013, and issued Nov. 3, 2015 as U.S. Pat. No. 9,178,517, both of which are hereby incorporated by reference in their entireties.

BACKGROUND

Technical Field

The present disclosure relates to dual gate transistors built on substrates having a buried oxide layer and, in particular, to the use of such dual gate transistors in integrated circuits to improve circuit performance.

Description of the Related Art

Integrated circuits typically incorporate N-doped and P-doped metal oxide semiconductor field effect transistor (MOSFET) devices in which current flows through a semiconducting channel between a source and a drain, in response to a bias voltage applied to a gate. When the applied voltage exceeds a characteristic threshold voltage $V_t$, the device switches on. Ideally, such a switch: a) passes zero current when it is off; b) supplies large current flow when it is on; and c) switches instantly between the on and off states. Unfortunately, a transistor is not ideal as constructed in an integrated circuit and tends to leak current even when it is off. Current that leaks through, or out of, the device tends to drain the battery that supplies power to the device.

For many years, integrated circuit transistor performance was improved by shrinking critical dimensions to increase switching speed. However, as dimensions of silicon-based transistors continue to shrink, maintaining control of various electrical characteristics, including off-state leakage, becomes increasingly more challenging, while performance benefits derived from shrinking the device dimensions have become less significant. It is therefore advantageous, in general, to increase switching speed and to reduce leakage current in the transistor by alternative means, including changes in materials and device geometry.

One technology that has been developed to control current leakage is the silicon-on-insulator (SOI) transistor. Examples of conventional planar (2-D) SOI transistor structures built on substrates having a buried oxide (BOX) layer are shown in FIGS. 1A and 1B and described below in greater detail. To provide better control of the current flow in the channel, dual gate SOI transistors have been developed, such as the exemplary dual gate SOI transistor shown in FIG. 2, described in U.S. Patent Publication No. 2010/0264492. A dual gate transistor is an electronic switching device in which current flow within the semiconducting channel of a traditional FET is controlled by two gates instead of one, so as to influence the current flow from two opposing surfaces instead of one.

Extending this idea further, 3-D tri-gate transistors have been developed in which the planar semiconducting channel of a traditional FET is replaced by a 3-D semiconducting fin that extends outward, normal to the substrate surface. In such a device, the gate, which controls current flow in the fin, wraps around three sides of the fin so as to influence the current flow from three surfaces instead of one or two. The improved control achieved with such dual gate and tri-gate designs results in lower threshold voltages, faster switching performance, and reduced current leakage.

BRIEF SUMMARY

According to principles of the various embodiments as discussed herein, an apparatus and method of making are described that incorporate dual gate field effect transistors implemented with fully depleted silicon-on-insulator (FD-SOI) technology. The FD-SOI dual gate devices include a BOX layer adjacent to the secondary gate that acts as a gate oxide for the secondary gate. Lowering the $V_t$ of the transistors can be accomplished through dynamic secondary gate control in which a back-biasing technique is used to operate the dual gate FD-SOI transistors with enhanced switching performance. By coupling both primary and secondary gates of the dual gate FD-SOI devices together, the threshold voltage of the device is lowered during the transition from the off state to the on state, by enhancing the amount of charge required to form an inversion region in the channel of the transistor. Meanwhile, conventional direct current (DC) conditions are maintained during steady state operation. Consequently, such transistors can operate at very low core voltage supply levels, down to as low as 0.4 V, which allows the transistors to respond quickly and to switch at higher speeds. Such high performance devices run on a much wider range of power supplies and can operate at higher frequencies. Because no components are added, integrated circuits that incorporate the dual gate FD-SOI devices are more area efficient.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

Figures 1A, 1B:
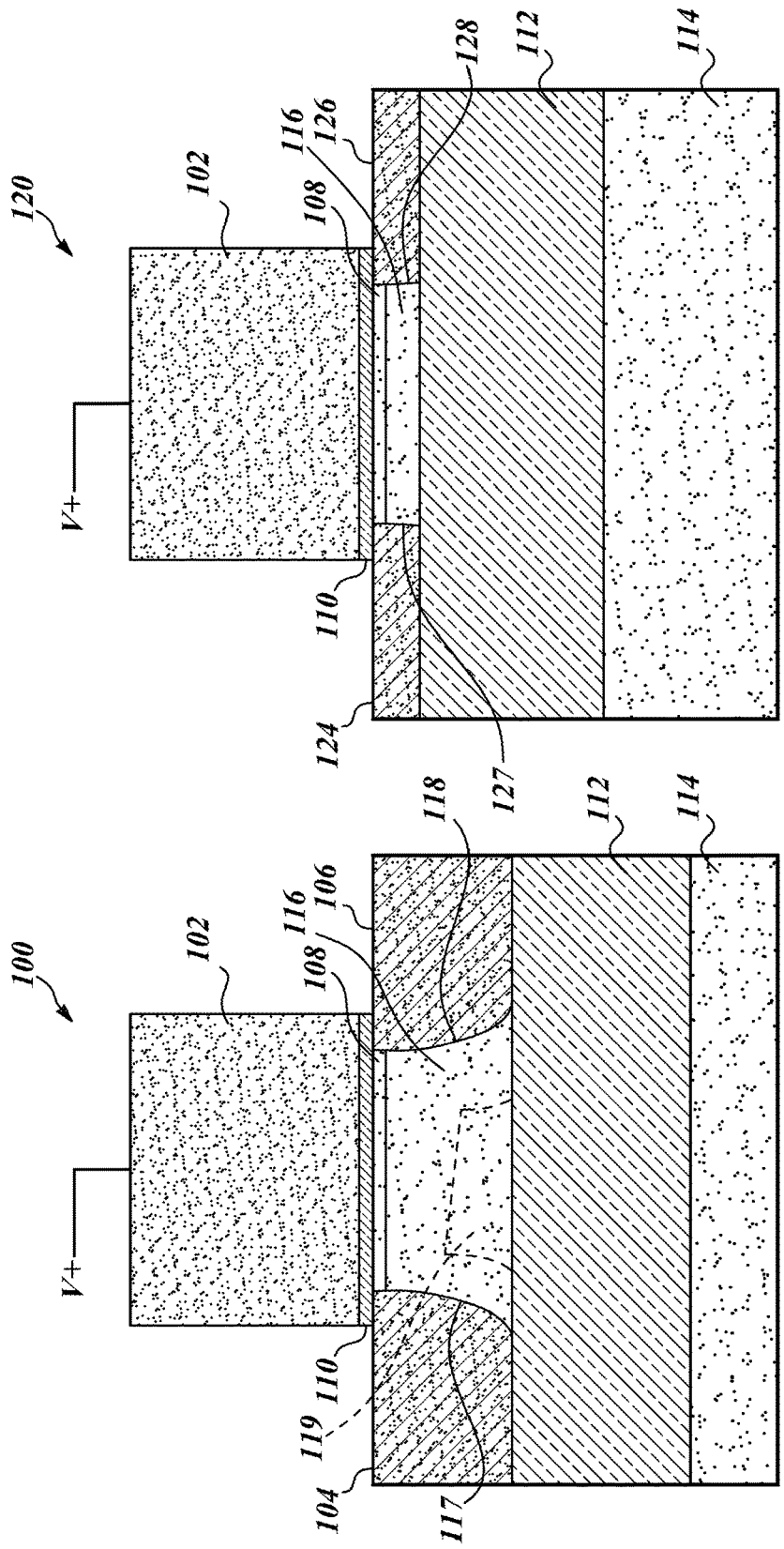
FIGS. 1A and 1B are cross sections of existing silicon-on-insulator devices that illustrate partially depleted and fully depleted channels.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with NMOS and PMOS transistors and associated circuits have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to dual gate FD-SOI transistors that have been produced; however, the present disclosure and the reference to certain materials, dimensions, and the details and ordering of processing steps are exemplary and should not be limited to those shown.

FIGS. 1A and 1B provide general information about SOI transistors, familiar to those skilled in the art of transistor design. In particular, FIGS. 1A and 1B illustrate what is meant by the terms "partially depleted" and "fully depleted" transistors. FIG. 1A shows a partially depleted MOS SOI transistor 100 in cross section. Like standard bulk MOS transistors, the partially depleted SOI transistor 100 is a three-terminal device in which a voltage applied to a gate 102 causes current to flow from a source 104 to a drain 106 through a channel 108. The gate 102 is separated from the rest of the device by a thin capacitive gate oxide layer 110. A bulk silicon substrate 114 may be doped, for example, with negative ions, to form an NWELL region. The partially depleted SOI transistor 100 differs from a bulk MOS transistor in that there exists a buried oxide (BOX) layer 112 between the channel 108 and the bulk silicon substrate 114. A depletion region 116, depleted of charge, that forms below the channel 108, between the source and drain regions 104 and 106, is then bounded below by the BOX layer 112. The depletion region can also be referred to as an inversion region. Normally, the presence of the BOX layer prevents the substrate voltage from electrically influencing the channel 108. The extent of the depletion region then depends on the relative dimensions of the various layers, as well as source and drain doping profiles, 117 and 118, respectively, and doping concentrations of the source and drain regions. In the case of the partially-depleted SOI device shown in FIG. 1A, the depletion region 116 does not fill all of the material between the source and the drain, wherein an un-depleted portion 119 remains at an undetermined floating electric potential. The presence of the un-depleted portion 119 is generally undesirable because it is not well controlled, and yet the associated floating electric potential can electrically influence the channel and degrade the transistor performance.

A fully depleted SOI (FD-SOI) transistor 120 is shown in FIG. 1B in cross section. Like the partially depleted SOI transistor 100 shown in FIG. 1A, the FD-SOI transistor 120 also has a BOX layer 112. However, the source and drain regions of the FD-SOI device, 124 and 126 respectively, are shallower than the source and drain regions 104 and 106 of the FD-SOI device 120. As a result, doping profiles 127 and 128 are effectively vertical, and the charge characteristics of the channel can be set by the doping concentrations such that a fully charge-depleted region 116 forms between the shallow source and drain regions 124 and 126, bounded below by the BOX layer 112, in response to application of a bias voltage to the gate 102. Because all of the material between the source and drain is charge-depleted, the un-depleted portion 119 shown in FIG. 1A has been eliminated as a possible cause of transistor degradation.

Figure 2:
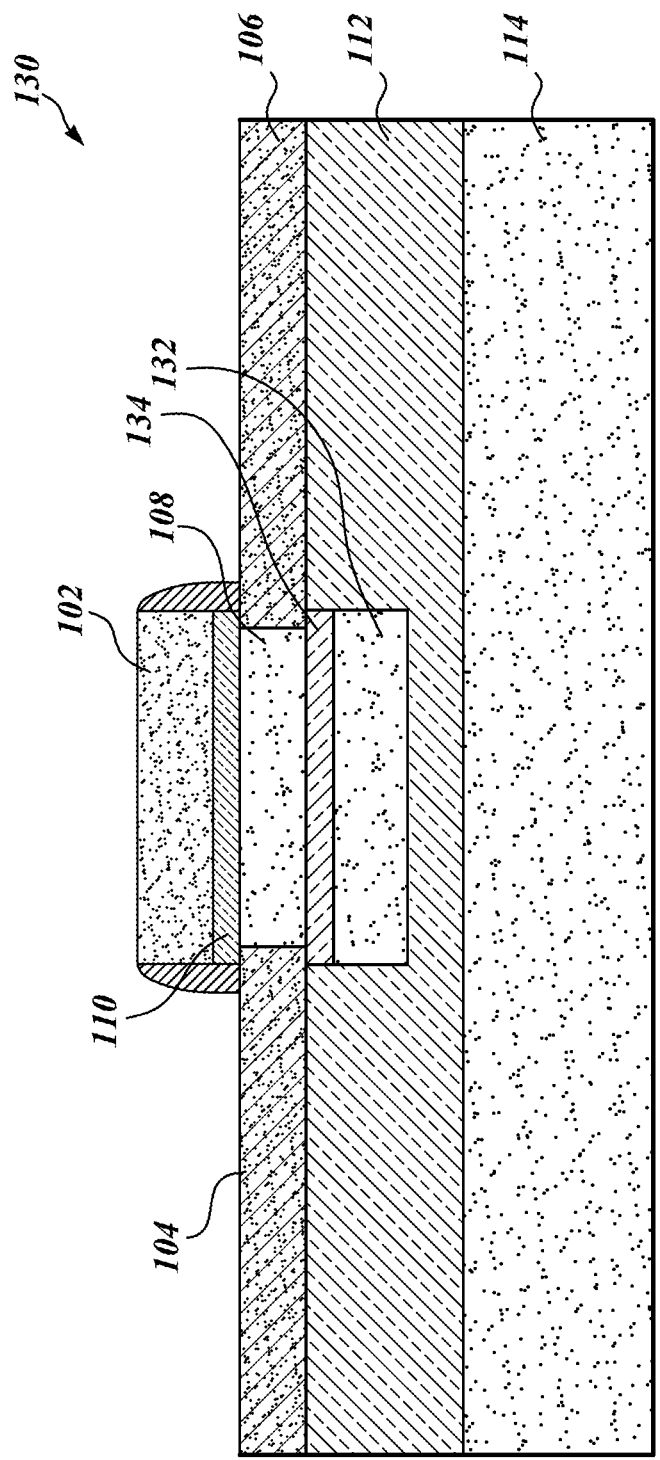
FIG. 2 is a cross section of a typical dual gate SOI transistor according to the prior art.

FIG. 2 shows a generalized example of the architecture of a typical dual gate SOI transistor 130 as shown in U.S. Patent Publication No. 2010/0264492. Like the conventional MOS and SOI devices, the dual gate SOI transistor 130 has a primary gate 102, a source 104 and a drain 106 on either side of a channel 108, wherein the primary gate 102 is separated by a thin primary gate oxide layer 110. In addition, the dual gate SOI transistor 130 includes a secondary gate 132, which is separated from the channel region 108 by a thin, secondary gate oxide layer 134. Both the primary and secondary gates 102 and 132 can be biased so as to influence current flow in the channel region 108. The dual gate SOI transistor 130 is usually operated by coupling the secondary gate 132 to a supply voltage or to ground, while a bias voltage is applied to the primary gate 102.

Figure 3A:
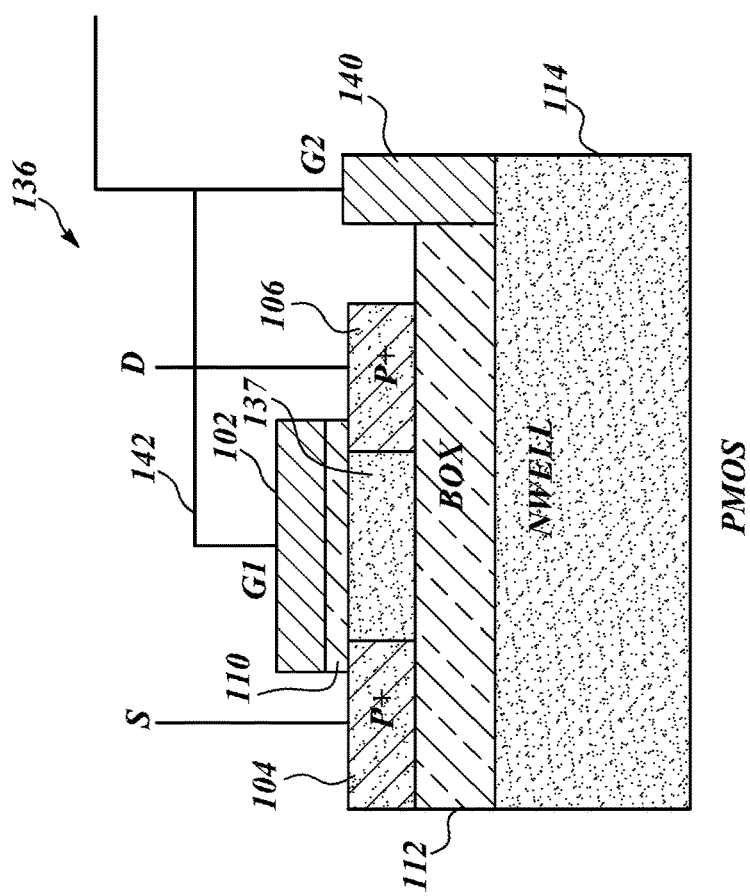
FIGS. 3A and 3B are cross-sectional and schematic diagrams of a dual gate FD-SOI PMOS transistor, as described herein.
Figure 4B:
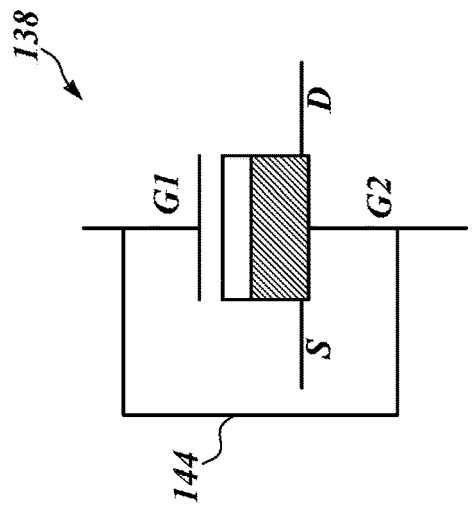
FIGS. 4A and 4B are cross-sectional and schematic diagrams of a dual gate FD-SOI NMOS flip-well transistor, respectively, as described herein.
Figure 4A:
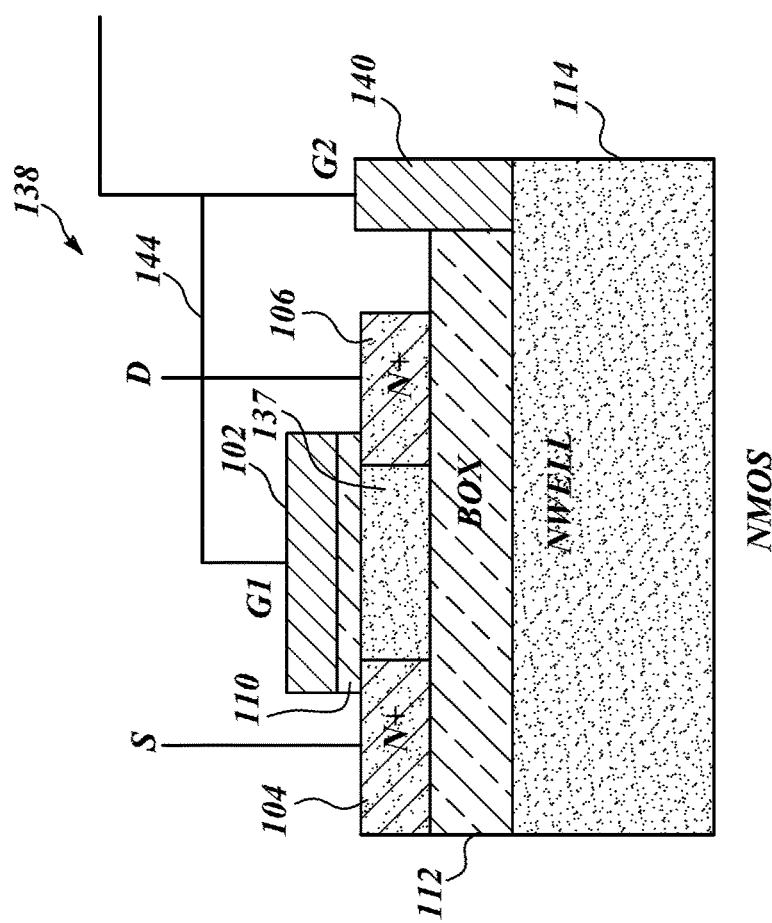

FIGS. 3A and 4A show cross-sectional representations of a dual gate PMOS FD-SOI transistor 136 and a dual gate NMOS FD-SOI transistor 138, respectively, as disclosed herein. The cross-sectional views more clearly show the structure of the dual gate FD-SOI transistors for direct comparison with the conventional dual gate transistor 130 shown in FIG. 2. Like the dual gate SOI transistor 130, dual gate FD-SOI transistors are four-terminal devices having a source S, a drain D, a primary gate G1, and a secondary gate G2. In the dual gate PMOS FD-SOI transistor 136 shown in FIG. 3A, for example, the channel 137 can be controlled by a bias voltage applied to either the primary gate G1, or the secondary gate G2, or both.

Unlike the dual gate SOI transistor 130, in the embodiment shown in FIG. 3A, the secondary gate G2 is the substrate, which is doped to form the NWELL region 114, as is customary and well known in the art. Furthermore, the secondary gate G2 can be biased by applying a voltage to the NWELL region 114 of the substrate via a front side NWELL contact 140. The secondary gate G2 is spaced apart from the channel 137 by a secondary gate oxide layer which, in the embodiment shown, is the BOX layer 112. Thus, between G1 and G2, there exist two capacitances, $C_{gate}$ across the primary gate oxide layer 110, and $C_{box}$ across the BOX layer 112. The BOX layer 112 provides a much thicker capacitive dielectric than does the gate oxide layer 110.

It is noted that the PMOS FD-SOI device shown in FIG. 3A is formed in the NWELL region 114, in the conventional way that is well known in the art, whereas the NMOS FD-SOI device shown in FIG. 4A is also formed in an NWELL region 114, which is unconventional. Typically an N-type transistor is formed in a PWELL region. Depending on the circuit application of the FD-SOI device, the polarity of the well doping, as well as the doping concentration, can be adjusted so as to produce the most desirable electrical effect. Consequences of such design choices can be evaluated using device simulations.

In the circuit applications disclosed herein, the secondary gates of each of the dual gate FD-SOI transistors can be thought of as being short-circuited to their respective primary gates. Hence, G1 and G2 are shown as tied together in FIGS. 3A and 4A by electrical connections 142 and 144, respectively. The effect of coupling the primary and secondary gates together is that the secondary gate back-biases the transistor to create an inversion layer in the channel region faster than usual. This causes the threshold voltage to be lower so that the device turns on easier, and the transition time from the low state to the high state is therefore shorter. Because the primary gate is also biased high at the same time, the back-biasing translates to an improvement in the switching performance.

The back-biasing technique is not effective when used with dual gate bulk transistors because the performance of bulk devices is subject to limitations that do not affect FD-SOI devices. One such limitation is that the bias voltage is limited to a range of about 200-300 mV in bulk technologies, because the gate oxide is so thin. This limitation does not exist in an FD-SOI device because the source and drain are fully isolated from the substrate by the BOX layer 112. Another limitation that affects bulk transistors is that the effectiveness of a body bias degrades as transistor dimensions shrink in subsequent technology generations. The body bias becomes ineffective at about the 20 nm node.

Figure 3B:
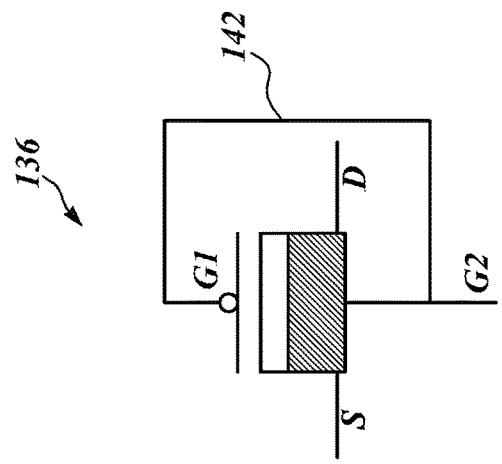

The dual gate FD-SOI transistors 136 and 138 as described herein are represented schematically in FIGS. 3B and 4B, configured as pass gates. It is noted that the gate terminals G1 and G2 are coupled together by the electrical connectors 142, 144 during operation of both the PMOS and NMOS devices. The output voltage of a pass gate has the same value as its input. Thus, a pass gate can be made by coupling together the primary and secondary gates of the dual gate FD-SOI transistors 136 and 138. It is further noted that the PMOS FD-SOI transistor 136 switches on in response to a negative voltage applied to the gates G1 and G2, because in a PMOS device, charge carriers in the channel 137 are positively charged holes. Thus, the PMOS device is shown as having an inverted input at the primary gate G1.

Figure 5:
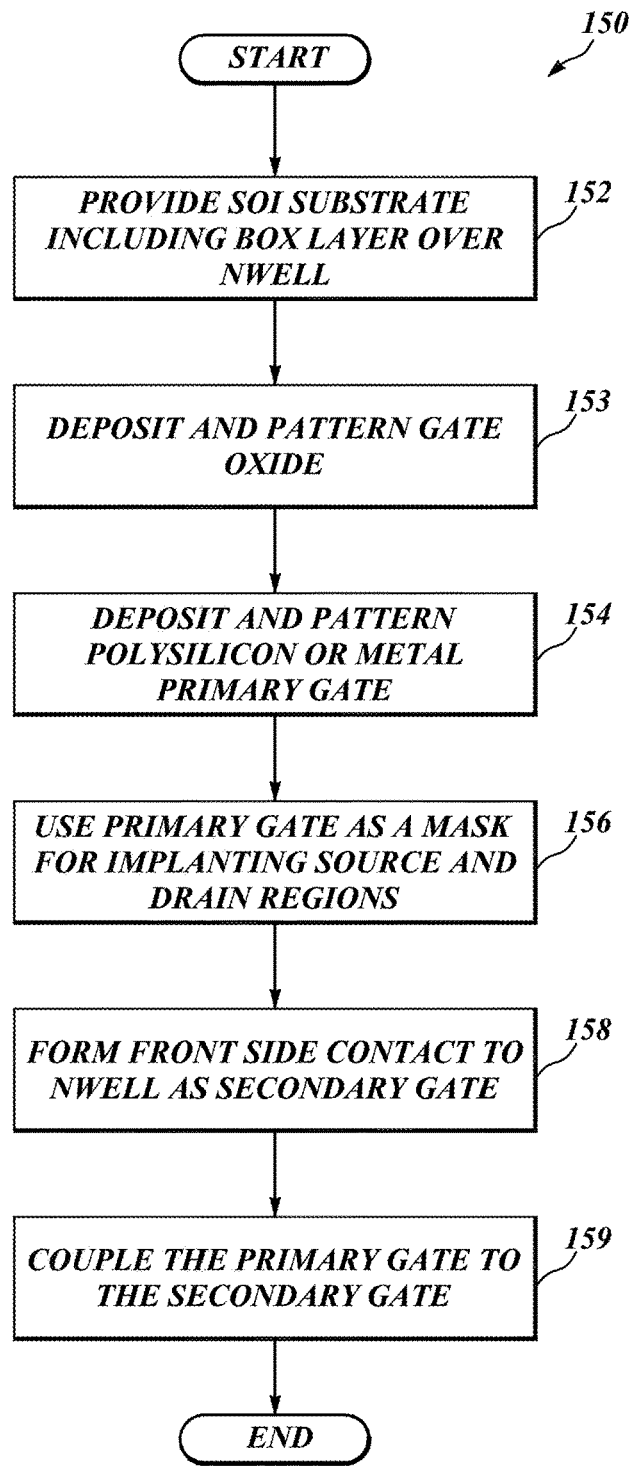
FIG. 5 is a flow diagram showing steps in a method of making a dual gate FD-SOI device, as described herein.

FIG. 5 shows high level steps in a method 150 of making the dual gate FD-SOI transistors 136 and 138 shown in FIGS. 3A and 4A, respectively.

At 152, a starting material is provided as a silicon-on-insulator (SOI) wafer that includes the BOX layer 112 over a heavily N-doped region, which is the NWELL region 114. In one embodiment, the BOX layer 112 has a thickness within the range of about 15-30 nm so that it can sustain application of up to about ±3.3 V to the NWELL region 114 without experiencing a structural breakdown. The thickness of the BOX layer 112 is large compared with the gate oxide layer 110 separating the primary gate G1 from the channel 137. However, the BOX layer 112 is thin compared with a typical BOX layer, which can be as thick as about 100 nm. An SOI wafer of the ultrathin body and buried oxide (UTBB) type, for example, will provide the desired thickness of the BOX layer. The SOI wafer includes an active region above the BOX layer 112 in which the transistor is formed. The active region thickness can be in the range of about 10-200 nm, but is desirably between 10 and 50 nm for the devices described herein.

At 153, the gate oxide layer 110 is formed on the surface of the active region of silicon by depositing a thin layer of silicon dioxide, or a high-k dielectric material such as hafnium oxide, for example. The gate oxide thickness is typically about 10 nm.

At 154, the primary gate 102 is deposited and both the gate 102 and the gate oxide layer 110 are patterned using standard deposition, lithography, and etching techniques well known in the art. The primary gate 102 can be made of polysilicon or metal, common materials well known in the art.

At 156, the primary gate 102 is used as a mask for doping the source and drain regions 104 and 106, respectively, by implanting either positive ions or negative ions, as is known in the art. The penetration depth of ions implanted into the silicon substrate is limited by the location of the BOX layer 112.

At 158, the front side NWELL contact 140 is formed by etching and filling a trench that extends through the BOX layer 112 to the top of the NWELL region 114.

At 159, the primary gate G1 (102) is coupled to the secondary gate G2 by the electrical connection 142. The electrical connection 142 can be an integral connection made according to a wiring design at an interconnect layer, for example, metal 1, formed after the transistor is complete.

While the techniques used to form layers within the dual gate FD-SOI transistors 136 and 138 are well known, formation of the structures is unique to the disclosed embodiments. In particular, such structures include the contact 140 to the NWELL region 114 for use as a secondary gate, and separation of the secondary gate from the channel 137 by the BOX layer 112.

FIGS. 6A-9 show exemplary embodiments of different circuit elements implemented using the dual gate FD-SOI devices 136 and 138, and demonstrate their advantages over conventional circuit elements. In each circuit application, performance improvements are achieved by back-biasing the devices i.e., biasing the secondary gate G2 by connecting it to the primary gate G1, and applying a bias voltage to both gates. Through such a back-biasing technique, current within the channel 137 is controlled from both the top side and the back side, instead of only from one side. The channel 137 is therefore more responsive to the biasing voltage. Furthermore, instead of the BOX layer isolating the substrate 114 from the active region, the substrate 114 is used to control the active region dynamically, through the BOX layer 112. The greater degree of sensitivity achieved by the BOX-controlled back-biasing technique means that the device turns on at a lower bias threshold voltage $V_t$, and the current in the channel responds more quickly to voltage changes, which means that the device can operate at higher frequencies.

Such performance enhancements are evident in the plots below, which are derived from circuit simulations. Simulation results were obtained using ELDO circuit simulation software available from Mentor Graphics, Inc. of Wilsonville, Oreg. In the circuit simulations, conventional transistor parameters are replaced by parameters describing the dual gate FD-SOI transistors, which are then driven using the back-biasing technique.

Figure 6A:
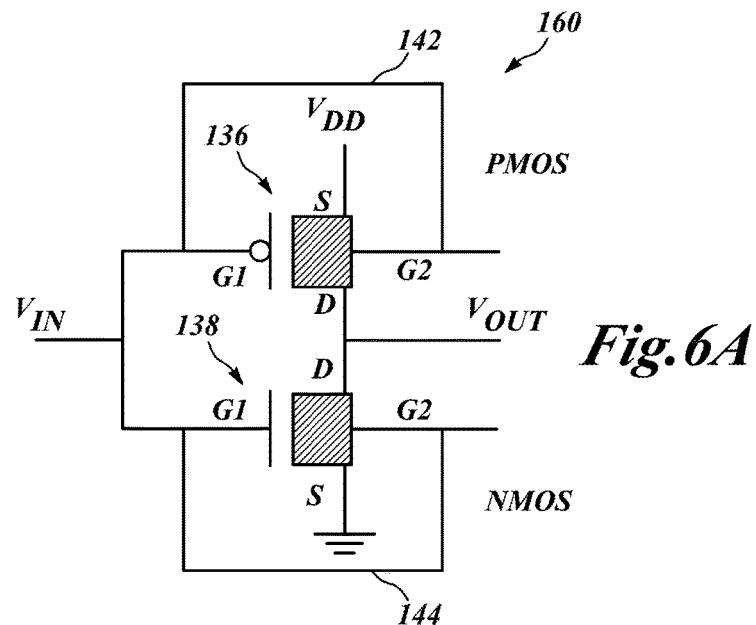
FIG. 6A is a schematic diagram of a dual gate FD-SOI inverter circuit module as described herein.

FIG. 6A shows a dual gate inverter 160 created by coupling together the PMOS dual gate FD-SOI device 136 and the NMOS dual gate FD-SOI device 138 in a standard inverter configuration. The standard inverter configuration includes a supply voltage $V_{DD}$ applied to the source terminal of the PMOS device 136, ground applied to the drain terminal of the NMOS device 138, an input voltage $V_{in}$ applied to both the primary gates, and the drain terminal of the PMOS device 136 coupled to the source terminal of the NMOS device 138 at the output of the inverter. In addition, in the present dual gate inverter 160, the primary and secondary gates G1 and G2 of each device are shorted together at 142 and 144, respectively.

Figure 6B:
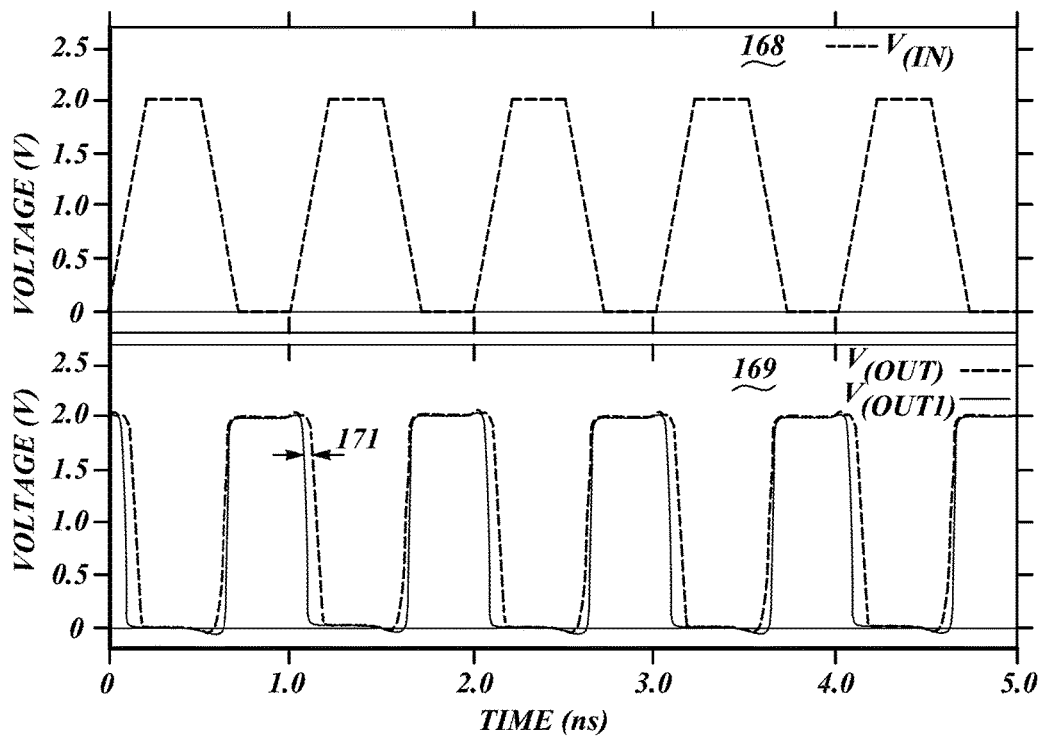
FIG. 6B is a plot of simulated voltage waveforms associated with the dual gate FD-SOI inverter circuit module shown in FIG. 6A.

FIG. 6B shows simulation results testing the performance of the dual gate inverter 160 as shown in FIG. 6A. FIG. 6B includes a top panel 168 and a bottom panel 169. The top panel 168 shows a time-varying input voltage signal $V_{in}$, which resembles a triangular wave having a maximum amplitude of 2 V and a frequency of 1 GHz. The bottom panel 169 shows time-varying output voltage signals $V_{out0}$, which correspond to a conventional inverter circuit element, and $V_{out1}$, which corresponds to the dual gate inverter 160 as described herein. An ideal inverter output signal would look like an upside-down $V_{in}$, such that whenever $V_{in}$ is on at 2.0 V, $V_{out}$ is off at 0 V, and vice versa.

By comparing the bottom panel 169 with the top panel 168, it is clear that the signal $V_{out1}$ responds faster than does the signal $V_{out}$ to changes in the input voltage signal $V_{in}$. For example, as soon as $V_{in}$ rises, $V_{out1}$ drops, whereas there is a delay $\Delta t$ 171 before $V_{out}$ responds. Taking into account both the rise time and fall time delays associated with $V_{out}$, a performance improvement of nearly 30% is evident in the simulation of the dual gate inverter 160. The faster response associated with the dual gate inverter 160 can be attributed to the channels 137 in each of the NMOS and PMOS devices being influenced simultaneously from both sides by the primary and secondary gates G1 and G2, wherein G2 is the N-doped substrate acting through the BOX layer 112. Under the influence of both G1 and G2, formation of the inversion region that provides a conduction path from source to drain via the channel 137 occurs faster.

Figure 7A:
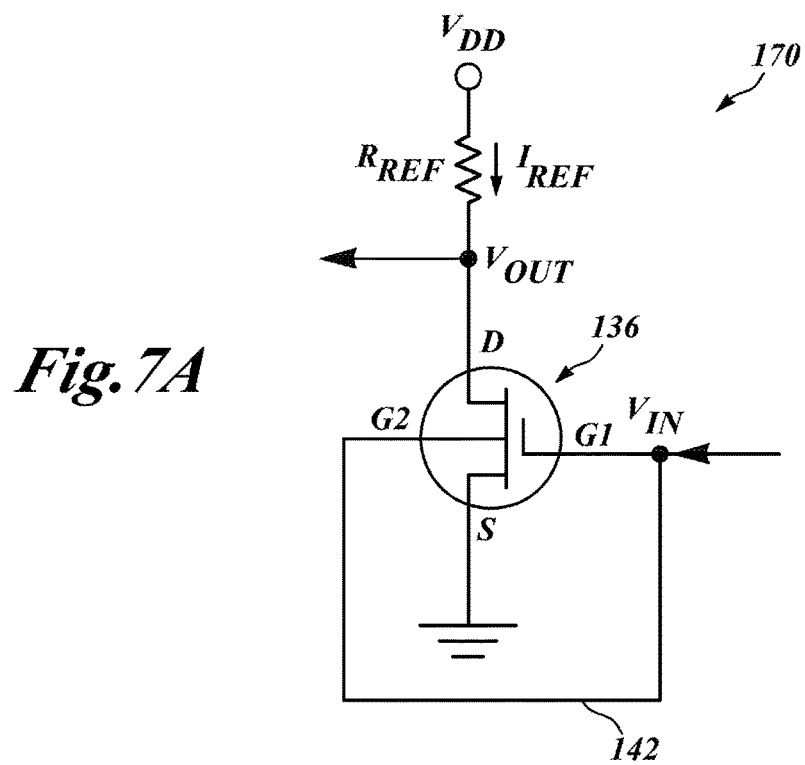
FIG. 7A is a schematic diagram of a dual gate FD-SOI amplifier circuit module as described herein.

FIG. 7A shows a dual gate amplifier 170 created by coupling the PMOS dual gate FD-SOI device 136 and a reference resistor $R_{ref}$ in a standard amplifier configuration. The standard amplifier configuration includes a supply voltage $V_{DD}$ applied to the source terminal of the PMOS device 136 through the reference resistor $R_{ref}$, ground applied to the drain terminal of the PMOS device 136, and an input voltage $V_{in}$ applied to the primary gate G1. In addition, in the present dual gate amplifier 170, the primary and secondary gates G1 and G2 of the PMOS device 136 are shorted together at 142.

Figure 7B:
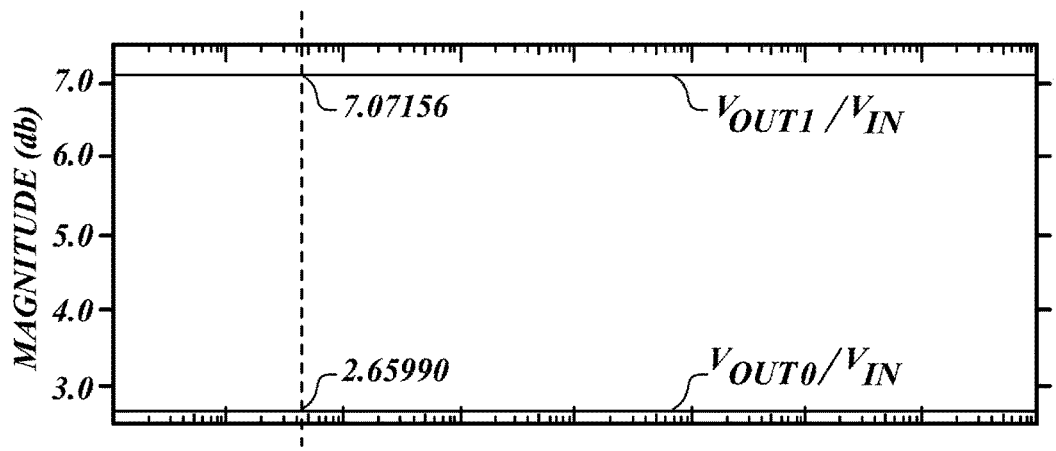
FIG. 7B is a plot of simulated amplifier performance associated with the dual gate FD-SOI amplifier circuit module shown in FIG. 7A.

FIG. 7B shows simulation results testing the performance of the dual gate amplifier 170 as shown in FIG. 7A. The expected behavior of an amplifier is to boost the magnitude of the input signal to a higher value. FIG. 7B shows the magnitude in decibels of the amplifier gain, which is the ratio of $V_{out}/V_{in}$. The bottom gain value $V_{out0}/V_{in}$=2.66 dB corresponds to a conventional amplifier circuit element and the top gain value $V_{out1}/V_{in}$=7.07 dB corresponds to the dual gate amplifier 170 as described herein. The dual gate amplifier 170 therefore shows a gain that is about 2.7 times larger than the conventional amplifier gain. By coupling the primary and secondary gates G1 and G2 together, the threshold voltage of the dual gate transistor is effectively lowered, which boosts the output voltage.

Figure 8A:
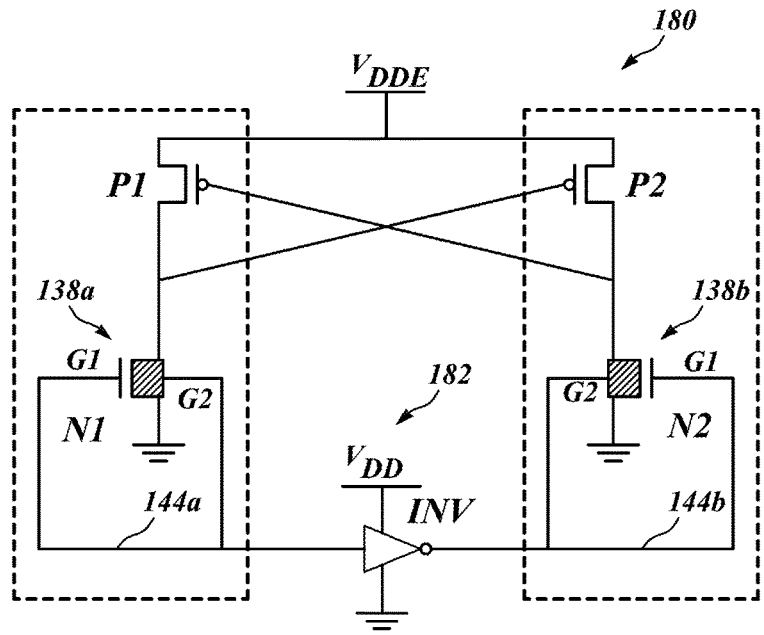
FIG. 8A is a schematic diagram of a level shifter circuit configured with a dual gate transistor circuit module, as described herein.

FIG. 8A shows a dual gate level shifter circuit 180 created by coupling two conventional PMOS devices and two NMOS dual gate FD-SOI devices 138a and 138b in the level shifter configuration shown. The level shifter configuration includes applying a supply voltage $V_{DD}$ to the source terminals of the PMOS devices, and cross-coupling the PMOS devices to the source terminals of the NMOS dual gate FD-SOI devices 138a,b. The level shifter configuration further includes coupling the gates of the NMOS dual gate FD-SOI devices 138a,b across an inverter 182, and grounding the drain terminals of the NMOS dual gate FD-SOI devices 138a,b. In the present dual gate level shifter circuit 180, the primary and secondary gates G1 and G2 in each of the NMOS devices 138a,b are shorted together at 144a and 144b, respectively, so that a bias voltage applied to the primary gate activates the secondary gate simultaneously, resulting in a faster turn-on time for the transistor.

Figure 8B:
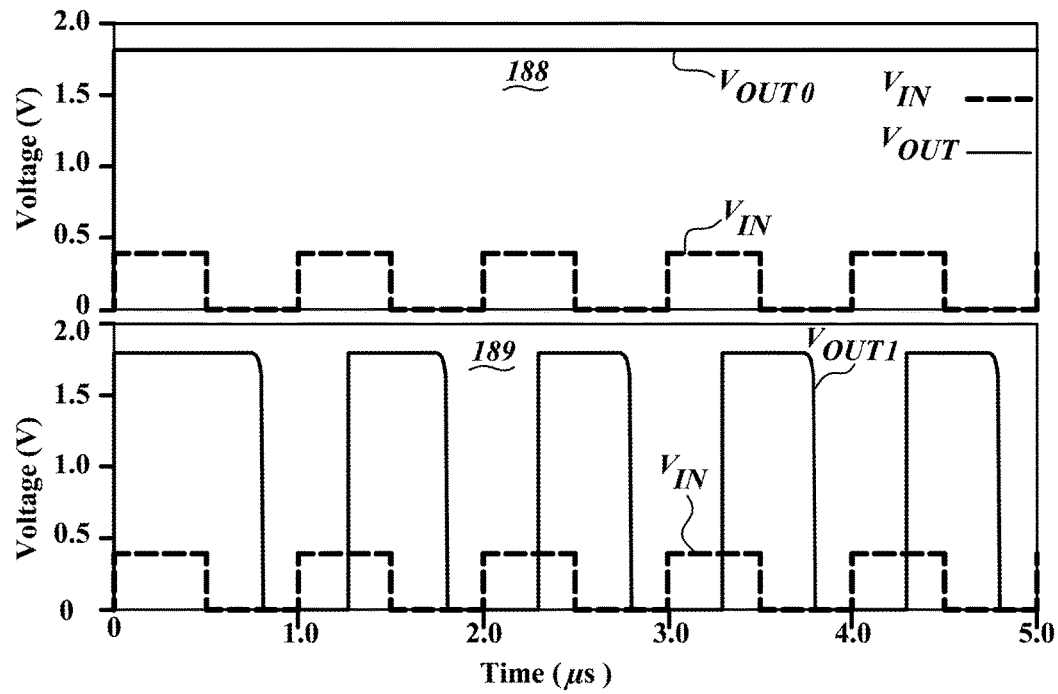
FIG. 8B is a plot of simulated performance associated with the dual gate FD-SOI level shifter circuit module shown in FIG. 8A.

FIG. 8B shows simulation results testing the performance of the dual gate level shifter circuit 180 as shown in FIG. 8A against that of a conventional level shifter that includes conventional NMOS devices. Expected behavior of the level shifter circuit is to shift the magnitude of the input signal to a higher value so that a low core supply voltage is sufficient to operate the circuit. FIG. 8B includes a top panel 188 and a bottom panel 189. The top panel 188 shows a time-varying input voltage signal $V_{in}$ which resembles a square wave having a maximum amplitude of about 0.4 V and a frequency of 1 MHz, corresponding to a period of 1.0 µs. An ideal level shifter output signal would look similar to $V_{in}$, except the amplitude would be shifted to a higher value. It is observed that the top panel 188 shows an output signal $V_{out0}$ that is shifted to a higher voltage level of about 1.8 V, but that $V_{out0}$ remains at 1.8 V continuously.

In contrast, the bottom panel 189, which corresponds to the dual gate level shifter circuit 180 as described herein, shows that the improved output voltage signal $V_{out1}$ also boosts the 0.4 V input signal up to about 1.8 V, but the dual gate level shifter circuit 180 is able to respond to the input signal with only about a 0.3 µs delay. At the relatively low frequency of 1 MHz, $V_{out1}$ has the desired square wave shape. The faster response associated with the dual gate level shifter 180 can be attributed to the channel 137 in each of the NMOS devices being influenced simultaneously from both sides by primary and secondary gates.

Further discussion of level shifter circuit configurations that use dual gate transistors is found in U.S. patent application Ser. No. 14/078,236.

Figure 9A:
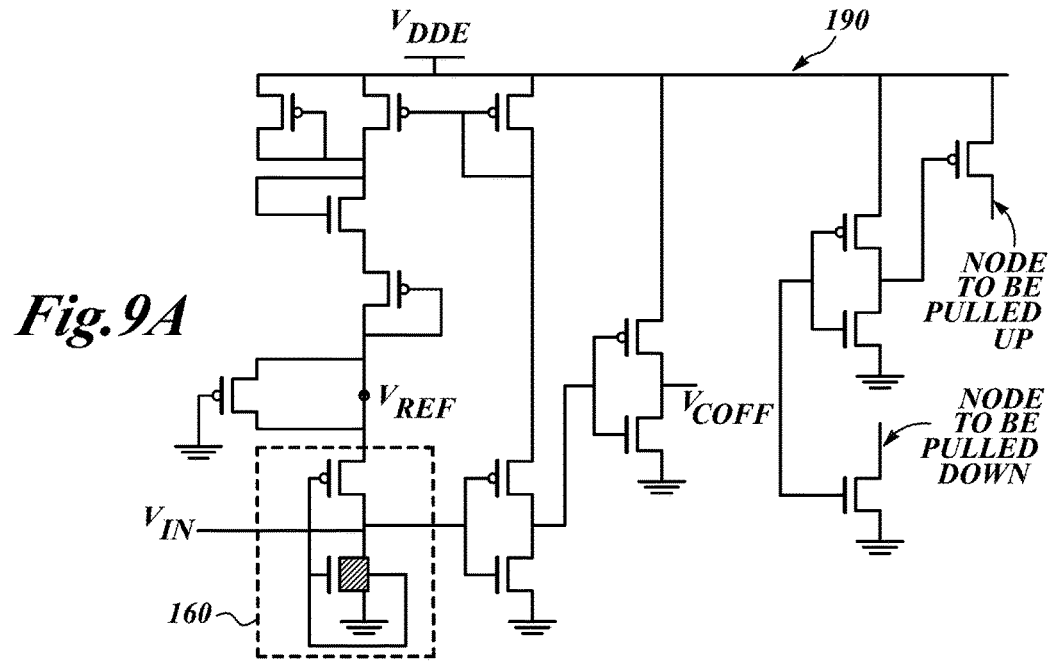
FIG. 9A is a schematic diagram of a core supply detection circuit configured with a dual gate transistor circuit module, as described herein.

FIG. 9A shows a core supply detection circuit 190. A core supply detection circuit is a voltage detection circuit for low voltage levels, for example, a low voltage core supply. At the input stage a dual gate inverter 160 of the type shown and described with respect to FIG. 6A receives an input voltage $V_{in}$. In some embodiments $V_{in}$ can be coupled to $V_{DD}$ as the input voltage. In other embodiments, $V_{in}$ can be other voltages. The core supply detection circuit 190 can be configured with one or more dual gate inverters 160 at different locations beyond the one example shown. Again, the NMOS device interconnect is formed with the primary and secondary gates coupled together for improved performance in detecting low voltages, as explained herein. When both the primary and secondary gates are influencing the channel 137 through the BOX layer 112, the threshold voltage of the device is effectively lowered, such that the dual gate inverter 160 turns on in response to application of a lower bias voltage. As a result, the detection circuit 190 is more sensitive to low voltages than is a conventional detection circuit.

Figure 9B:
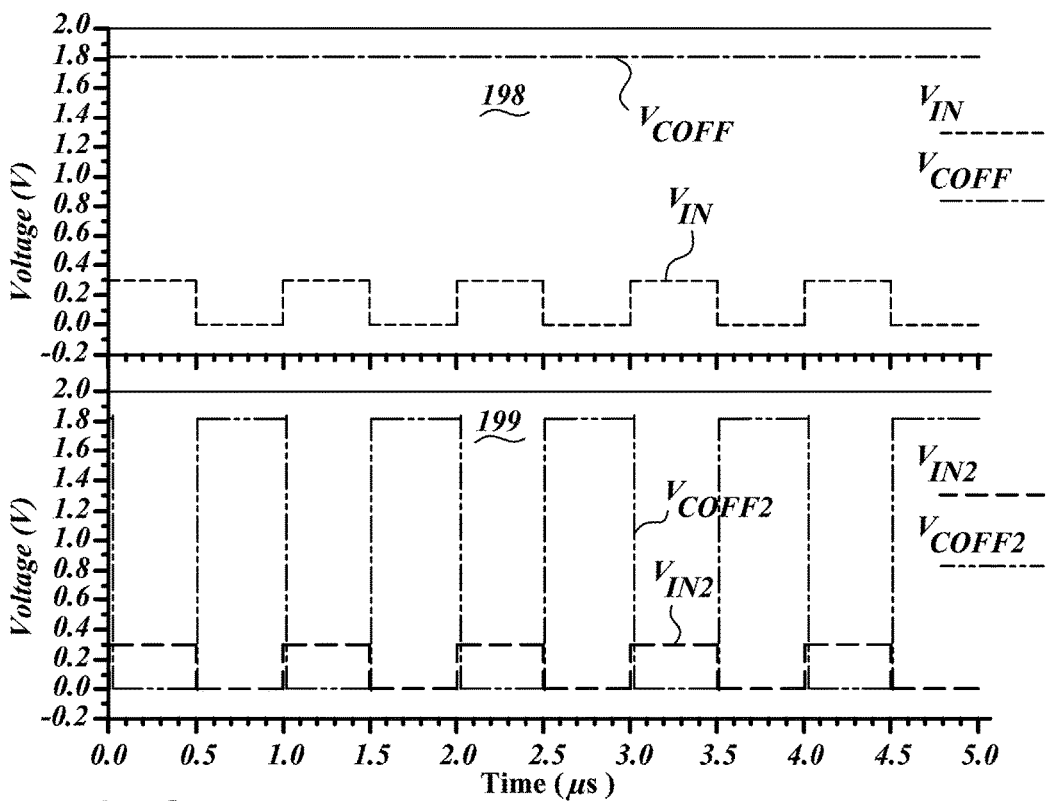
FIG. 9B is a plot of simulated performance associated with the core supply detection circuit module shown in FIG. 9A.

FIG. 9B shows simulation results testing the performance of the core supply detection circuit 190 as shown in FIG. 9A against that of a conventional core supply detection circuit that includes conventional inverters at every stage. Expected behavior of the core supply detection circuit is to turn on when $V_{IN}$ switches off, and remain high until $V_{IN}$ switches on again. FIG. 9B includes a top panel 198 and a bottom panel 199. The top panel 198 shows a time-varying input voltage signal $V_{IN}$, which resembles a square wave having a maximum amplitude of about 0.3 V and a frequency of 1 MHz, corresponding to a period of 1.0 µs. An ideal core supply detection circuit output signal would look similar to $V_{IN}$, except the signal amplitude would be boosted to a higher value, and inverted with respect to $V_{IN}$. It is observed that the top panel 198 shows an output signal $V_{COFF}$ that remains at 1.8 V continuously, indicating failure at a core supply of 0.3 V.

In contrast, the bottom panel 199, which corresponds to the core supply detection circuit 190 as described herein, shows that the improved output voltage signal $V_{COFF2}$ also boosts the 0.3 V input signal up to about 1.8 V, but the core supply detection circuit 190 is able to respond to the input signal with substantially no delay. At the relatively low frequency of 1 MHz, $V_{COFF2}$ has the desired inverted square wave shape and greater amplitude. The faster response associated with the dual gate core supply detection circuit 190 can be attributed to the channel 137 in the dual gate NMOS device within the inverter 160 being influenced simultaneously from both sides by primary and secondary gates.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a silicon substrate;
    a first doped well having a first conductivity type;
    a second doped well having the first conductivity type, the second doped well being physically separated from the first doped well;
    a first pass gate formed on the silicon substrate, the first pass gate including a fully-depleted silicon-on-insulator (FD-SOI) dual gate NMOS transistor having:
        a source terminal,
        a drain terminal,
        a primary gate,
        a secondary gate in the first doped well, the primary gate having a first surface that is spaced apart from the secondary gate by a first distance, and
        a secondary gate contact on the secondary gate, the secondary gate electrically coupled to the primary gate through the secondary gate contact, the secondary gate contact oriented in a direction transverse to the primary gate and extending from the secondary gate to a second surface, the second surface being spaced apart from the secondary gate by a second distance that is less than the first distance, each of the first voltage, the second voltage, and the third voltage being different from one another; and
    a second pass gate formed on the silicon substrate, the second pass gate including a FD-SOI dual gate PMOS transistor having:
        a source terminal, a drain terminal,
a primary gate,
a secondary gate in the second doped well, and
a secondary gate contact on the secondary gate, the secondary gate electrically coupled to the primary gate through the secondary gate contact, the secondary gate contact oriented in a direction transverse to the primary gate.

2. The device of claim 1 wherein an input is coupled to the primary gates and to the secondary gates of each of the NMOS transistor and the PMOS transistor, and an output is coupled to one of the source terminal and the drain terminal.

3. The device of claim 1 wherein the primary and secondary gates of each of the NMOS transistor and the PMOS transistor are accessible from a front side of the silicon substrate.

4. The device of claim 1 wherein the drain terminals of each of the NMOS transistor and the PMOS transistor are electrically coupled to one another.

5. The device of claim 1 wherein the first and second doped wells comprise first and second N-wells, respectively.

6. A device, comprising:
a silicon substrate;
a first n-well in the substrate;
a second n-well in the substrate, the second n-well physically separate from the first n-well;
a buried oxide layer on the first and second n-wells;
a NMOS dual gate transistor having:
 a source terminal configured to be electrically coupled to a first voltage,
 a drain terminal,
 a primary gate configured to be electrically coupled to a second voltage,
 a secondary gate in the first n-well, and
 a secondary gate contact on the secondary gate, the secondary gate electrically coupled to the primary gate and to the second voltage through the secondary gate contact, the primary and secondary gates being accessible from a front side of the silicon substrate, the first voltage and the second voltage being different from one another; and
a PMOS dual gate transistor having:
 a source terminal configured to be electrically coupled to a third voltage that is different from the first voltage and the second voltage,
 a drain terminal,
 a primary gate configured to be electrically coupled to the second voltage,
 a secondary gate in the second n-well, and
 a secondary gate contact on the secondary gate, the secondary gate electrically coupled to the primary gate and to the second voltage through the secondary gate contact, the primary and secondary gates being accessible from a front side of the silicon substrate.

7. The device of claim 6 wherein the secondary gate contacts of the PMOS and NMOS transistors are oriented in a direction transverse to the respective primary gates.

8. The device of claim 6 wherein the drain terminals of the PMOS and NMOS transistors are electrically coupled to one another.

9. The device of claim 8 wherein the first voltage is an electrical ground voltage.

10. The device of claim 9 wherein the second voltage is an input voltage, and the drain terminals of the PMOS and NMOS transistors provide an output voltage based on the input voltage.

11. A device, comprising:
a silicon-on-insulator substrate including a buried oxide layer over a first doped region and a second doped region, the first and second doped regions having a same conductivity type and being physically separate from one another;
a NMOS dual gate transistor including:
 a source region on the buried oxide layer;
 a drain region on the buried oxide layer;
 a channel region on the buried oxide layer and positioned between the source region and the drain region;
 a primary gate overlying the channel region;
 a secondary gate in the first doped region; and
 a secondary gate contact on the first doped region and in abutting contact with the buried oxide layer, the secondary gate contact being electrically coupled to the primary gate and the secondary gate; and
a PMOS dual gate transistor including:
 a source region on the buried oxide layer;
 a drain region on the buried oxide layer;
 a channel region on the buried oxide layer and positioned between the source region and the drain region;
 a primary gate overlying the channel region;
 a secondary gate in the second doped region; and
 a secondary gate contact on the second doped region and in abutting contact with the buried oxide layer, the secondary gate contact being electrically coupled to the primary gate and the secondary gate.

12. The device of claim 11 wherein the first doped region, the second doped region, the source region of the NMOS dual gate transistor, and the drain region of the NMOS dual gate transistor have the same conductivity type.

13. The device of claim 11 wherein the first doped region is a first N-well, and the second doped region is a second N-well.

14. The device of claim 11, further comprising a first gate oxide between the channel region and the primary gate of the NMOS dual gate transistor, and a second gate oxide between the channel region and the primary gate of the PMOS dual gate transistor, wherein the buried oxide layer has a thickness at least ten times larger than a thickness of each of the first and second gate oxides.

15. The device of claim 11 wherein the buried oxide layer has a thickness in the range of 15-30 nm.

16. The device of claim 11 wherein the primary gates of the NMOS and PMOS dual gate transistors are metal gates.

17. The device of claim 11 wherein the primary gates of the NMOS and PMOS dual gate transistors include polysilicon.

18. The device of claim 11 wherein the source region, the drain region, and the channel region of each of the NMOS and PMOS dual gate transistors have a thickness in the range of 10-50 nm.

19. The device of claim 11, further comprising a gate oxide between the channel region and the primary gate of one of the NMOS and PMOS dual gate transistors, the gate oxide having a thickness of about 10 nm.

20. The device of claim 11, further comprising a gate oxide between the channel region and the primary gate of one of the NMOS and PMOS dual gate transistors, the gate oxide including at least one of silicon dioxide and hafnium oxide.

* * * * *